US008274794B2

(12) United States Patent
Huang et al.

(10) Patent No.: US 8,274,794 B2
(45) Date of Patent: Sep. 25, 2012

(54) THREE-DIMENSIONAL SOC STRUCTURE FORMED BY STACKING MULTIPLE CHIP MODULES

(75) Inventors: Chun-Ming Huang, Hsinchu (TW); Chin-Long Wey, Hsinchu (TW); Chien-Ming Wu, Hsinchu (TW); Chih-Chyau Yang, Hsinchu (TW); Shih-Lun Chen, Hsinchu (TW); Chi-Shi Chen, Hsinchu (TW); Chi-Sheng Lin, Hsinchu (TW)

(73) Assignee: National Chip Implementation Center National Applied Research Laboratories, Hsinchu (TW)

( * ) Notice: Subject to any disclaimer, the term of this patent is extended or adjusted under 35 U.S.C. 154(b) by 300 days.

(21) Appl. No.: 12/752,345

(22) Filed: Apr. 1, 2010

(65) Prior Publication Data

US 2011/0188210 A1 Aug. 4, 2011

(30) Foreign Application Priority Data

Jan. 29, 2010 (TW) .............................. 99102491 A

(51) Int. Cl.
*H05K 7/00* (2006.01)
*H01L 23/48* (2006.01)
*H01L 23/52* (2006.01)
*H01L 29/40* (2006.01)

(52) U.S. Cl. ........................................ 361/735; 257/777

(58) Field of Classification Search .................. 361/735, 361/790, 301.4, 783, 794, 795; 257/777, 257/686, 685

See application file for complete search history.

(56) References Cited

U.S. PATENT DOCUMENTS

| | | | | |
|---|---|---|---|---|
| 5,426,563 A * | 6/1995 | Moresco et al. | ............. | 361/689 |
| 5,544,017 A * | 8/1996 | Beilin et al. | .................. | 361/790 |
| 6,093,969 A * | 7/2000 | Lin | ............................... | 257/777 |
| 6,249,052 B1 * | 6/2001 | Lin | ............................... | 257/737 |
| 7,038,322 B2 * | 5/2006 | Kazama et al. | ................ | 257/779 |
| 7,295,552 B1 * | 11/2007 | Kadambi et al. | .............. | 370/392 |
| 7,402,901 B2 * | 7/2008 | Hatano et al. | ................. | 257/684 |
| 7,511,595 B2 * | 3/2009 | Park et al. | ........................ | 333/133 |
| 7,566,956 B2 * | 7/2009 | Mitarai et al. | ................ | 257/678 |
| 7,723,836 B2 * | 5/2010 | Kwon et al. | ................... | 257/690 |
| 7,737,552 B2 * | 6/2010 | Beyne | ............................ | 257/724 |
| 7,755,177 B2 * | 7/2010 | Wey et al. | ...................... | 257/678 |
| 7,888,175 B2 * | 2/2011 | Krishnamoorthy et al. | .. | 438/108 |
| 2002/0071258 A1 * | 6/2002 | Mosley | ............................ | 361/782 |
| 2004/0256709 A1 * | 12/2004 | Hashimoto | ..................... | 257/686 |

(Continued)

*Primary Examiner* — Lisa Lea Edmonds
*Assistant Examiner* — Xanthia C Cunningham
(74) *Attorney, Agent, or Firm* — Stites & Harbison, PLLC; Juan Carlos A. Marquez, Esq.

(57) ABSTRACT

A three-dimensional SoC structure formed by stacking multiple chip modules is provided. The three-dimensional SoC structure includes at least two vertical SoC modules and at least one connector module, wherein each connector module electrically connects two vertical SoC modules. Each vertical SoC module is constructed by stacking at least two chip modules vertically. Each chip module includes a module circuit board and at least one preset element. A recess is formed in each module circuit board and provided with a first connecting interface for electrically connecting with the corresponding at least one preset element. The at least two vertical SoC modules are connected by the connector module to form a three-dimensional SoC structure with multiple functions. Besides, the recesses formed in the module circuit boards provide effective heat dissipation paths for the preset elements.

11 Claims, 12 Drawing Sheets

U.S. PATENT DOCUMENTS

| | | | |
|---|---|---|---|
| 2005/0194673 A1* | 9/2005 | Kwon et al. | 257/686 |
| 2006/0001163 A1* | 1/2006 | Kolbehdari et al. | 257/758 |
| 2006/0017147 A1* | 1/2006 | Drost et al. | 257/686 |
| 2006/0023439 A1* | 2/2006 | Fraley et al. | 361/780 |
| 2006/0049504 A1* | 3/2006 | Corisis et al. | 257/686 |
| 2006/0170508 A1* | 8/2006 | Tanaka | 331/154 |
| 2007/0033428 A1* | 2/2007 | Lin et al. | 713/500 |
| 2007/0182510 A1* | 8/2007 | Park et al. | 333/189 |
| 2007/0278642 A1* | 12/2007 | Yamaguchi et al. | 257/686 |
| 2008/0048324 A1* | 2/2008 | Hong | 257/741 |
| 2008/0054489 A1* | 3/2008 | Farrar et al. | 257/777 |
| 2008/0283992 A1* | 11/2008 | Palaniappan et al. | 257/686 |
| 2008/0308928 A1* | 12/2008 | Chang et al. | 257/723 |
| 2009/0020885 A1* | 1/2009 | Onodera | 257/777 |
| 2009/0040684 A1* | 2/2009 | Cremer et al. | 361/301.4 |
| 2009/0045523 A1* | 2/2009 | Fan et al. | 257/777 |
| 2009/0057919 A1* | 3/2009 | Lin et al. | 257/777 |
| 2009/0102036 A1* | 4/2009 | Hwang | 257/686 |
| 2009/0212410 A1* | 8/2009 | Wu et al. | 257/686 |
| 2009/0261466 A1* | 10/2009 | Pagaila et al. | 257/686 |
| 2010/0013108 A1* | 1/2010 | Gibson et al. | 257/777 |
| 2010/0019368 A1* | 1/2010 | Shin | 257/686 |
| 2010/0020509 A1* | 1/2010 | Xie et al. | 361/748 |
| 2010/0065949 A1* | 3/2010 | Thies et al. | 257/621 |
| 2010/0099582 A1* | 4/2010 | Chiu et al. | 506/39 |
| 2010/0134950 A1* | 6/2010 | Choi et al. | 361/301.4 |
| 2010/0181686 A1* | 7/2010 | Sugino et al. | 257/777 |
| 2010/0187670 A1* | 7/2010 | Lin et al. | 257/686 |
| 2010/0187671 A1* | 7/2010 | Lin et al. | 257/686 |
| 2010/0224984 A1* | 9/2010 | Sasaki et al. | 257/692 |
| 2010/0330741 A1* | 12/2010 | Huang et al. | 438/107 |

* cited by examiner

THREE-DIMENSIONAL SOC STRUCTURE FORMED BY STACKING MULTIPLE CHIP MODULES

BACKGROUND OF THE INVENTION

1. Technical Field

The present invention relates to a three-dimensional system-on-chip structure formed by stacking multiple chip modules. More particularly, the present invention relates to a three-dimensional system-on-chip structure which is formed by stacking a plurality of chip modules and applicable to system-on-chips.

2. Description of Related Art

A system-on-chip (SoC) refers to an integrated chip on a system level. In particular, a system-on-chip may include a computational element (e.g., a microprocessor, a digital signal processor, an image processor, etc.) as well as a memory, a logic circuit, an input/output circuit, and other connection circuits. In a nutshell, a system-on-chip is a single chip integrated with IC components which have different functions and are otherwise scattered in different chips. Therefore, a system-on-chip can be regarded as a single system having multiple functions.

At the front-end design stage of a SoC development process, system developers plan the desired components and architectures. These components and architectures may be designed by the system developers themselves or provided by a third party. In either case, however, it is the system developers who are responsible for manufacturing and verifying the finished products at the back-end fabrication and verification stages.

While system developers may incorporate the silicon intellectual property (SIP) of external design teams during the design stage, the remaining part of the development process, particularly fabrication and verification, cannot be outsourced. Although such a development process provides system developers with a high degree of autonomy and allows them to optimize product design at the latter stages, the costs of manpower and time are lofty. Therefore, if the design stage can be extended into and integrated with fabrication and verification, that is, if certain components of a system-on-chip are pre-fabricated and verified products, then system developers are allowed to focus only on the design, fabrication, and verification of those components with the additional extended functions. Thus, the time required for developing and testing the system-on-chip is significantly shortened, and design errors minimized, thereby lowering the development costs.

Moreover, as consumers strongly prefer electronic products featuring compactness, if the volume of system-on-chips is effectively reduced, the finished electronic products can be downsized to satisfy consumers.

BRIEF SUMMARY OF THE INVENTION

It is an object of the present invention to provide a three-dimensional SoC structure formed by stacking multiple chip modules, wherein each connector module electrically connects two vertical SoC modules to form the three-dimensional SoC structure, thus effectively decreasing the overall volume of the system-on-chip.

It is another object of the present invention to provide a three-dimensional SoC structure formed by stacking multiple chip modules, wherein each vertical SoC module is constructed by stacking at least two chip modules vertically, thus increasing the number of preset elements in a unit area.

It is still another object of the present invention to provide a three-dimensional SoC structure formed by stacking multiple chip modules, wherein both vertical SoC modules and chip modules can be fabricated and verified in advance to shorten the verification process of the system-on-chip.

It is yet another object of the present invention to provide a three-dimensional SoC structure which is formed by stacking multiple chip modules, thus allowing system designers to combine vertical SoC modules of different functions into various SoC structures.

It is a further object of the present invention to provide a three-dimensional SoC structure formed by stacking multiple chip modules, wherein vertical SoC modules can be fabricated and verified in advance so that system designers only have to design extended functions for special specifications. In consequence, the time and costs of development are reduced.

It is another object of the present invention to provide a three-dimensional SoC structure formed by stacking multiple chip modules, wherein each module circuit board is formed with a recess as a heat dissipation path, thereby enhancing heat dissipation of the system-on-chip.

To achieve the foregoing objects, the present invention provides a three-dimensional SoC structure formed by stacking multiple chip modules, wherein the three-dimensional SoC structure includes at least two vertical SoC modules and at least one connector module. Each vertical SoC module is formed by stacking at least two chip modules vertically, and each chip module includes a module circuit board and at least one preset element. Each module circuit board has a first surface and a second surface, wherein the first surface is sunken to form a recess having a first region, and the second surface has a second region opposite the first region. Each of the first and second regions is provided with a first connecting interface. In addition, the first surface and the second surface of each module circuit board are provided with a second connecting interface and a third connecting interface, respectively. Moreover, at least one preset element of each chip module is electrically connected to one of the first connecting interfaces of the corresponding module circuit board or is electrically connected to both of the first connecting interfaces of the corresponding module circuit board, respectively. Each connector module includes a connecting circuit board whose outer surface is provided with fourth connecting interfaces. Furthermore, each connector module electrically connects two vertical SoC modules. Each vertical SoC module is formed in such a way that the second connecting interface of one chip module is in contact, and therefore electrical connection, with the third connecting interface of another chip module.

To achieve the foregoing objects, the present invention also provides a vertical SoC module structure formed by stacking at least two chip modules vertically. Each chip module includes a module circuit board and at least one preset element. Each module circuit board has a first surface and a second surface, wherein the first surface is sunken to form a recess having a first region, and the second surface has a second region opposite the first region. Each of the first and second regions is provided with a first connecting interface. Moreover, the first surface and the second surface of each module circuit board are provided with a second connecting interface and a third connecting interface, respectively. At least one preset element of each chip module is electrically connected to one of the first connecting interfaces of the corresponding module circuit board or is electrically connected to both of the first connecting interfaces of the corresponding module circuit board, respectively. The vertical SoC module structure is formed in such a way that the second connecting interface of one chip module contacts with and is therefore electrically connected to the third connecting interface of another chip module.

To achieve the foregoing objects, the present invention further provides a chip module structure which includes a module circuit board and at least one preset element. The module circuit board has a first surface and a second surface. The first surface is sunken to form a recess. The recess has a first region while the second surface has a second region opposite the first region. Each of the first and second regions is provided with a first connecting interface. Furthermore, the first surface is provided with a second connecting interface, and the second surface is provided with a third connecting interface. The preset element is electrically connected to one of the first connecting interfaces or is electrically connected to both of the first connecting interfaces, respectively.

Implementation of the present invention at least involves the following inventive steps:

1. With at least one connector module, the vertical SoC modules can be added according to practical needs, thereby extending the functions of the system-on-chip easily.

2. Both the vertical SoC modules and the chip modules can be fabricated and verified in advance. Therefore, the verification process of the system-on-chip can be substantially shortened to reduce the time and costs of development.

3. The recesses in the module circuit boards function as heat dissipation paths in the vertical SoC modules, thus increasing the heat dissipation efficiency of the system-on-chip.

BRIEF DESCRIPTION OF THE SEVERAL VIEWS OF THE DRAWINGS

The invention as well as a preferred mode of use and advantages thereof will be best understood by referring to the following detailed description of the illustrative embodiment in conjunction with the accompanying drawings, wherein.

DETAILED DESCRIPTION OF THE INVENTION

Figure 1:
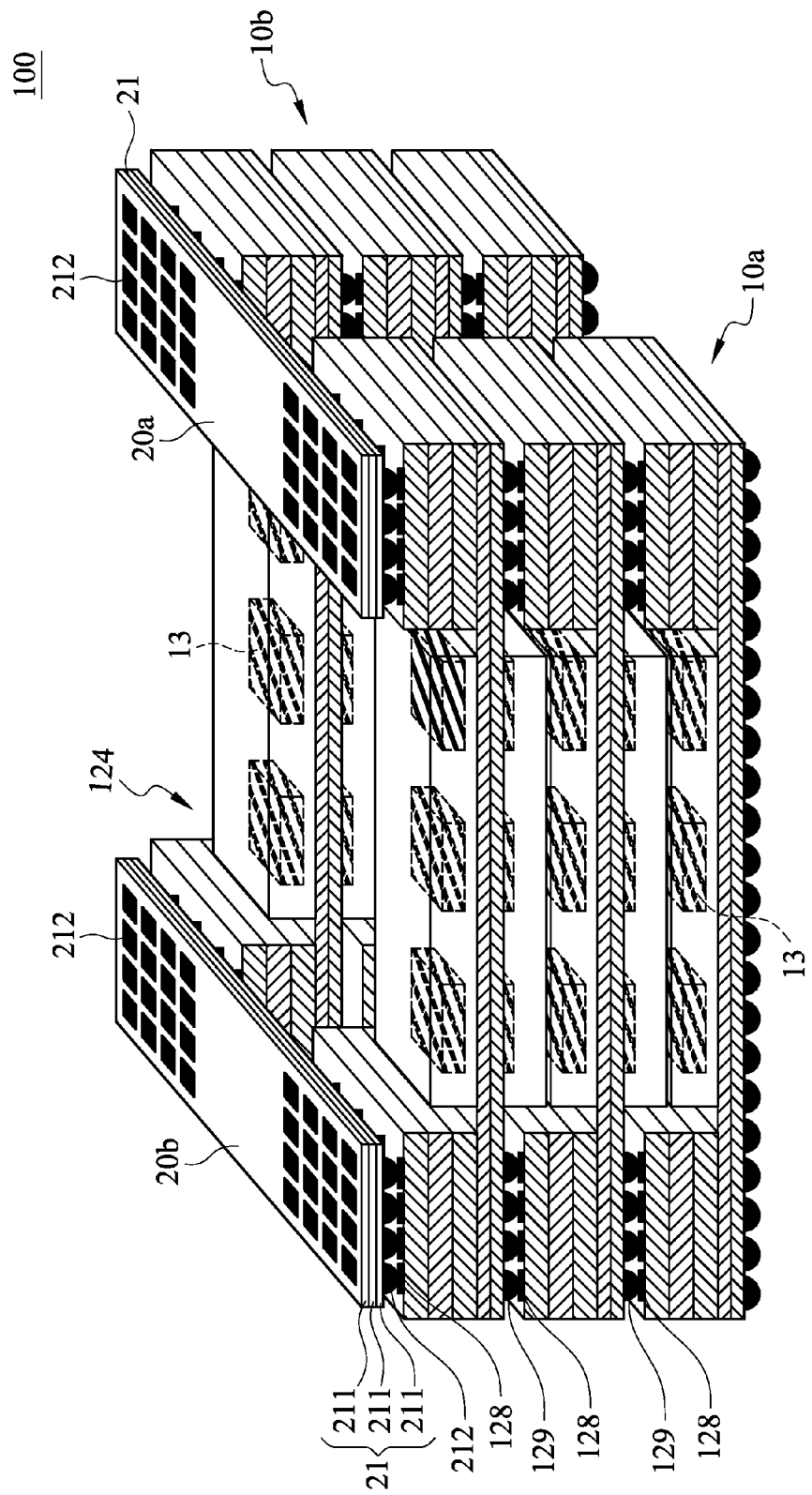
FIG. 1 is a perspective view of a three-dimensional SoC structure formed by stacking multiple chip modules according to the present invention.

Referring to FIG. 1, a three-dimensional SoC structure 100 formed by stacking multiple chip modules according to an embodiment of the present invention includes at least two vertical SoC modules 10a, 10b and at least one connector module 20a, 20b.

Figure 2A:
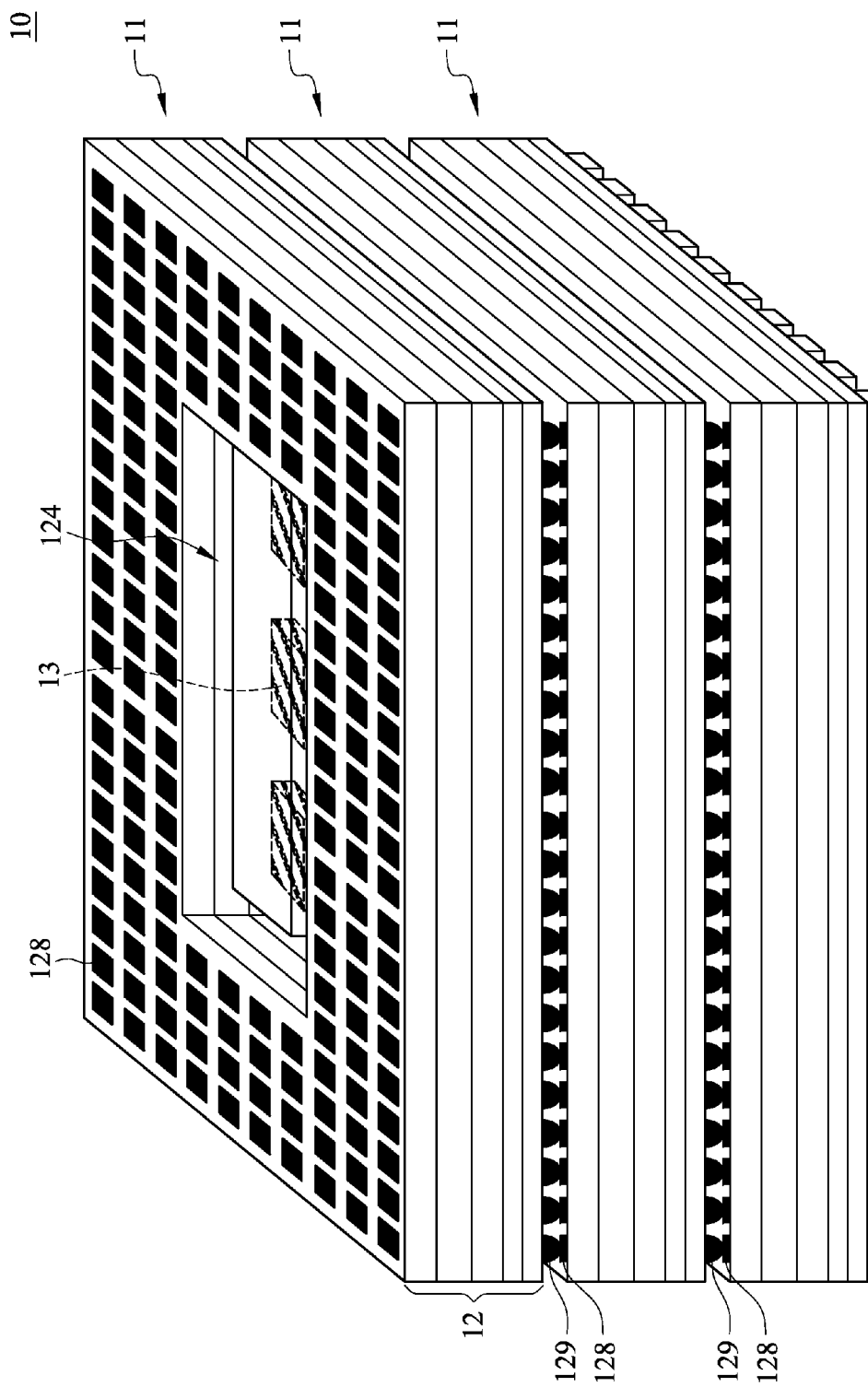
FIG. 2A is a perspective view of a first embodiment of a vertical SoC module according to the present invention.
Figure 2B:
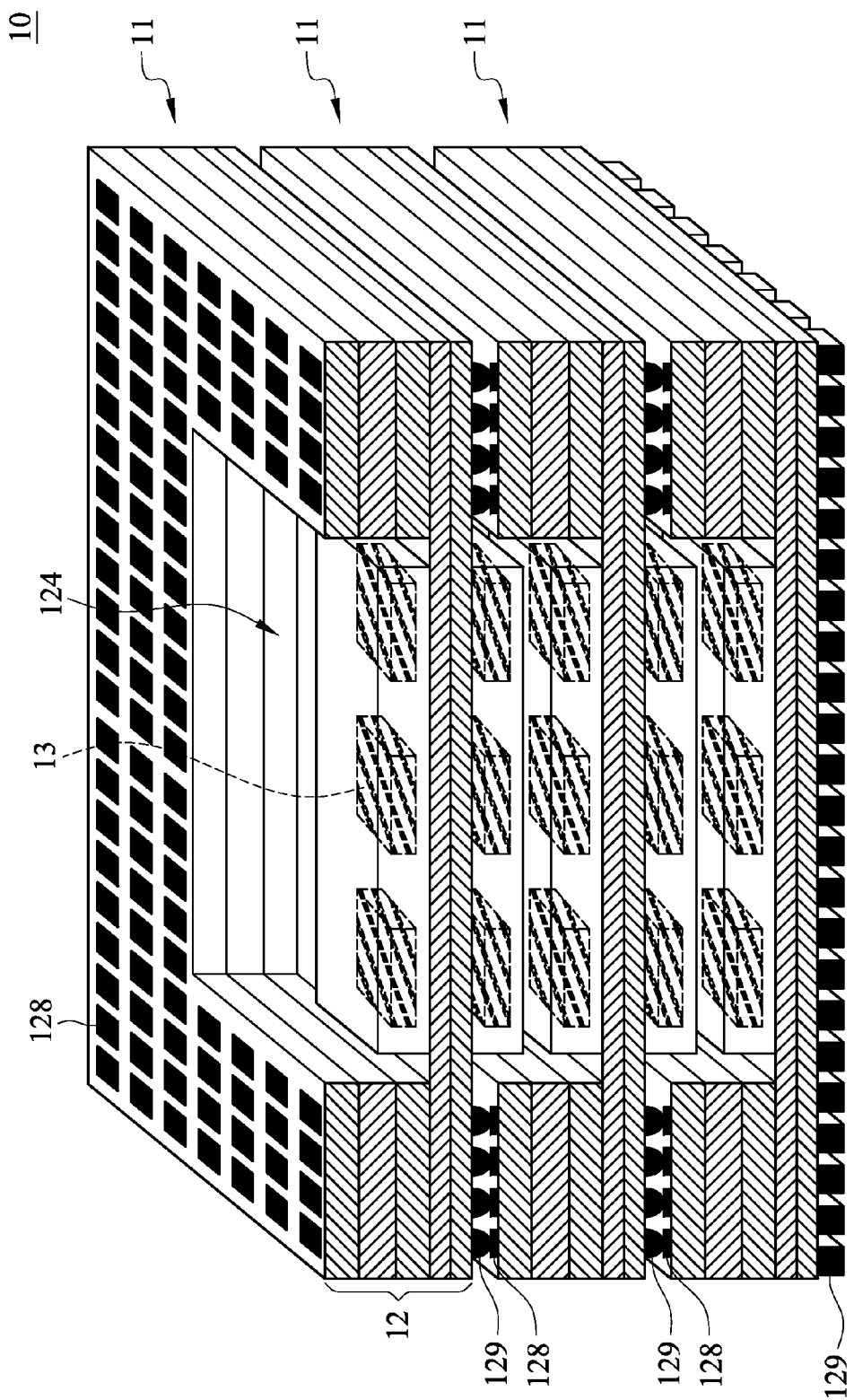
FIG. 2B is a perspective view of a second embodiment of the vertical SoC module according to the present invention.
Figure 2C:
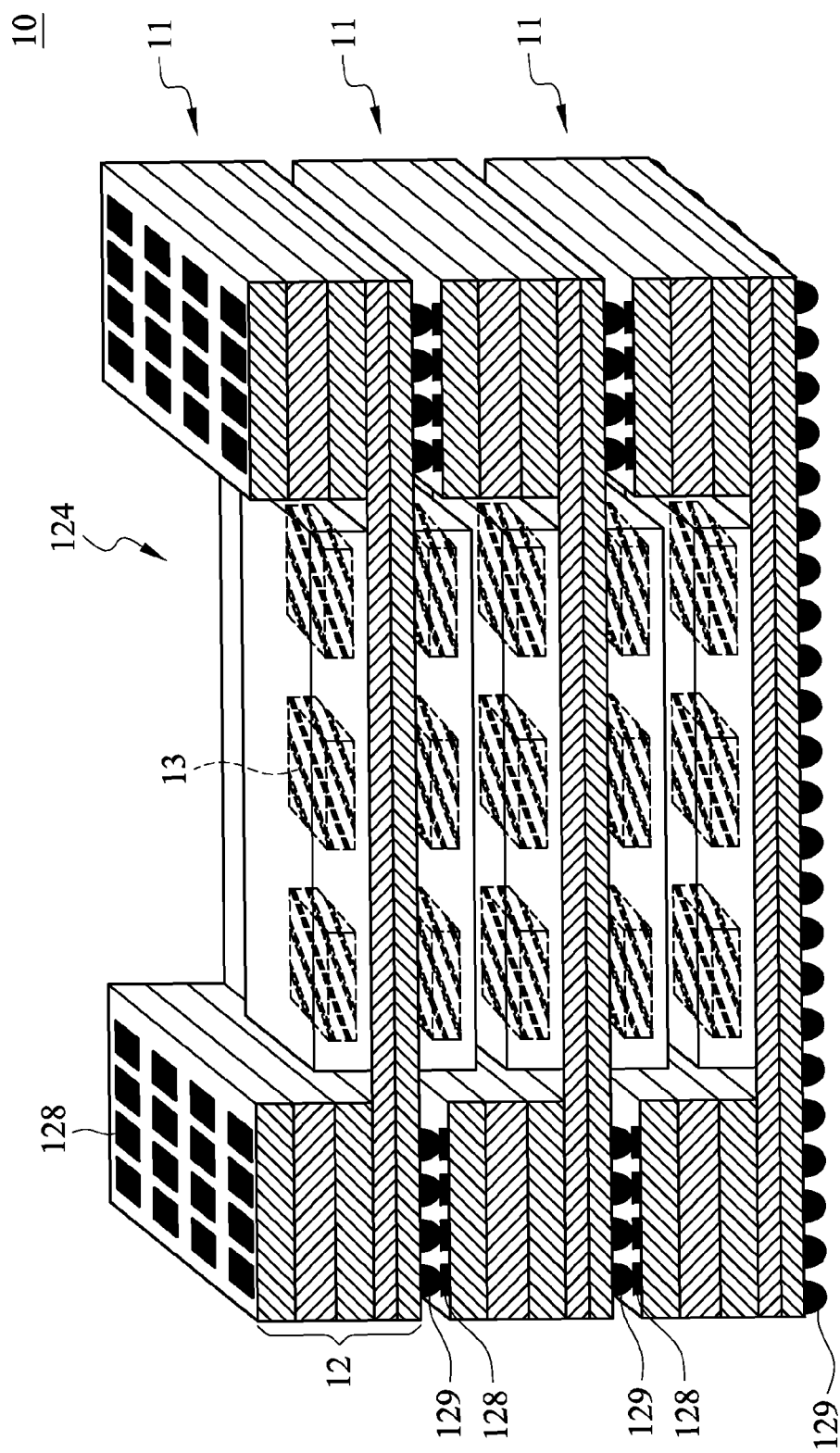
FIG. 2C is a perspective view of a third embodiment of the vertical SoC module according to the present invention.

As shown in FIG. 2A through FIG. 2C, each vertical SoC module 10 is formed by stacking at least two chip modules 11 vertically. The chip modules 11 can be fabricated and packaged at the same time or sequentially. Thus, system designers only have to stack vertically and connect the packaged chip modules 11 to complete the fabrication of each vertical SoC module 10. Furthermore, as each chip module 11 is fabricated and verified in advance, the verification process of the system-on-chip can be shortened significantly, thereby reducing the time and costs of development.

Each chip module 11 includes a module circuit board 12 and at least one preset element 13.

Figure 3A:
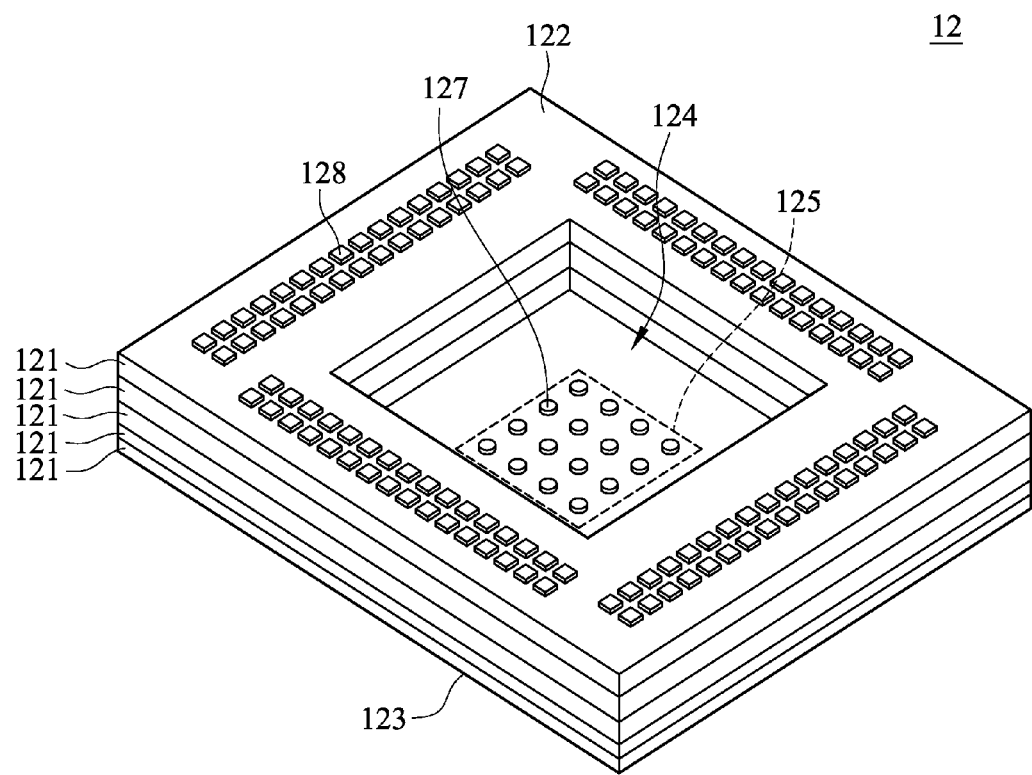
FIG. 3A is a top perspective view of the chip module according to the present invention.

With reference to FIG. 3A, the module circuit board 12 is composed of at least two circuit layers 121. The module circuit board 12 can be a multilayer printed circuit board or a multilayer ceramic circuit board. The outermost circuit layers 121 of the module circuit board 12 constitute a first surface 122 and a second surface 123 of the module circuit board 12, respectively. The first surface 122 can be defined as an upper surface of the module circuit board 12, and the second surface 123 can be defined as a lower surface of the module circuit board 12. The circuit layers 121, though each having an independent circuit design, are electrically connected to one another, thus allowing a high-density circuit structure to be built-in the module circuit board 12 for complex applications.

Figure 3B:
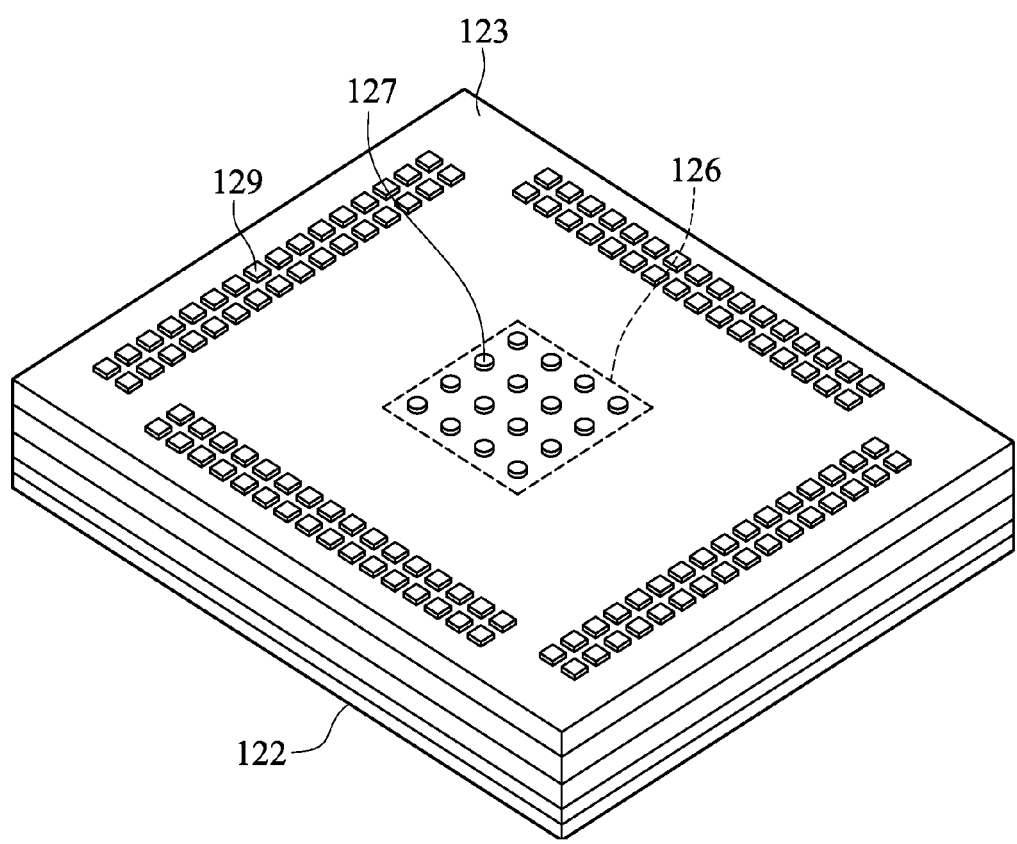
FIG. 3B is a bottom perspective view of the chip module according to the present invention.

The circuit layers 121 are so structured that the first surface 122 is sunken to form a recess 124. A first region 125 is defined in the recess 124 for connecting with at least one preset element 13. Moreover, referring also to FIG. 3B, a second region 126 is defined on the second surface 123 and located on the opposite side of the first region 125. Each of the first region 125 and the second region 126 is provided with a first connecting interface 127. In addition, a second connecting interface 128 is provided on a portion of the first surface 122 that is outside the recess 124, while a third connecting interface 129 is provided on a portion of the second surface 123 that is outside the second region 126, as shown in FIG. 3B. Each of the first connecting interface 127, the second connecting interface 128, and the third connecting interface 129 can be a solder ball array, a land grid array, or a pin grid array (not shown).

Figure 4:
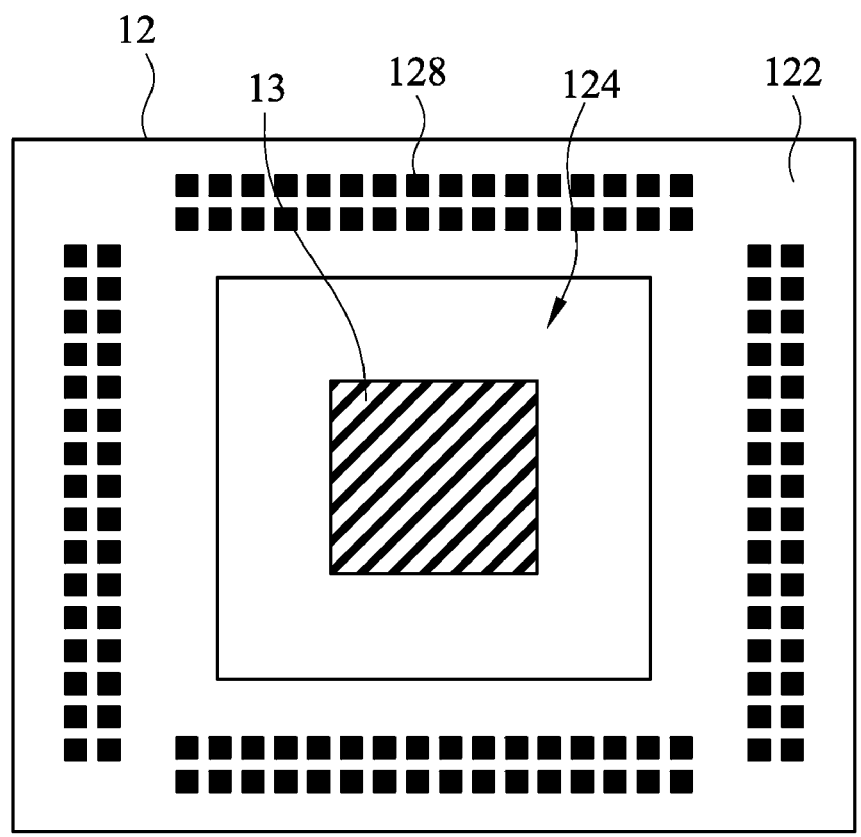
FIG. 4 shows a first aspect of the chip module according to the present invention.
Figure 5:
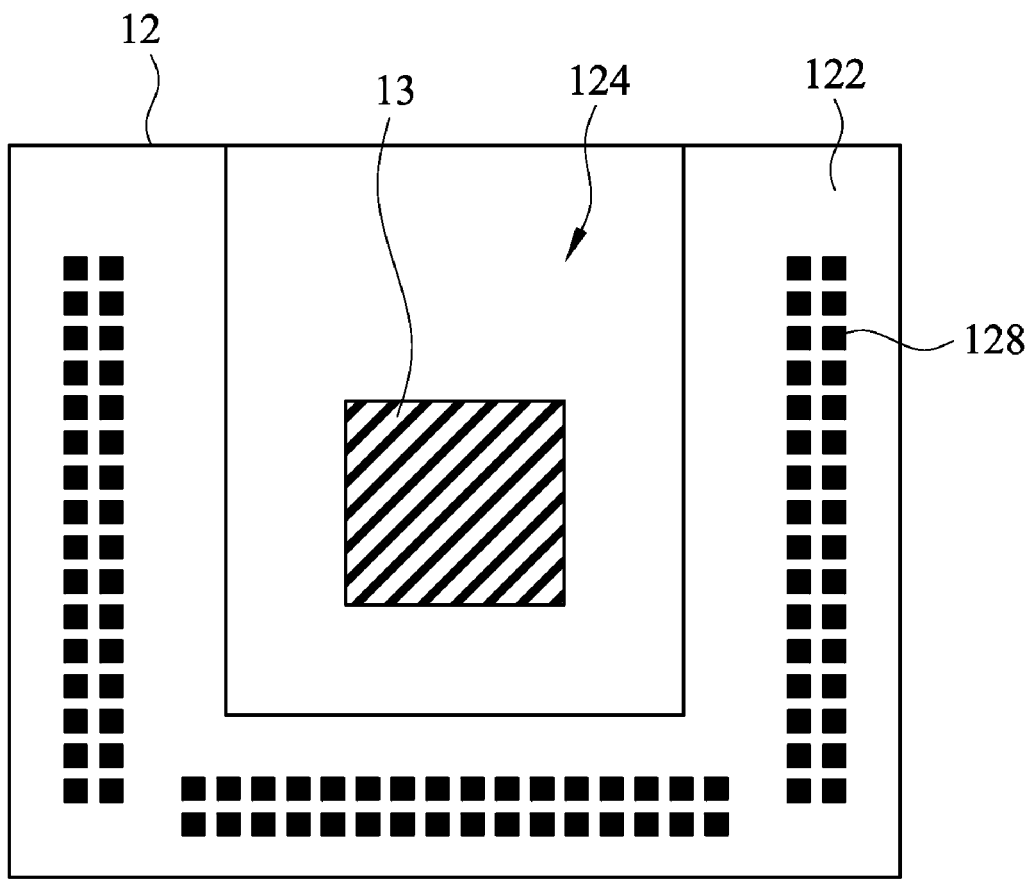
FIG. 5 shows a second aspect of the chip module according to the present invention.
Figure 6:
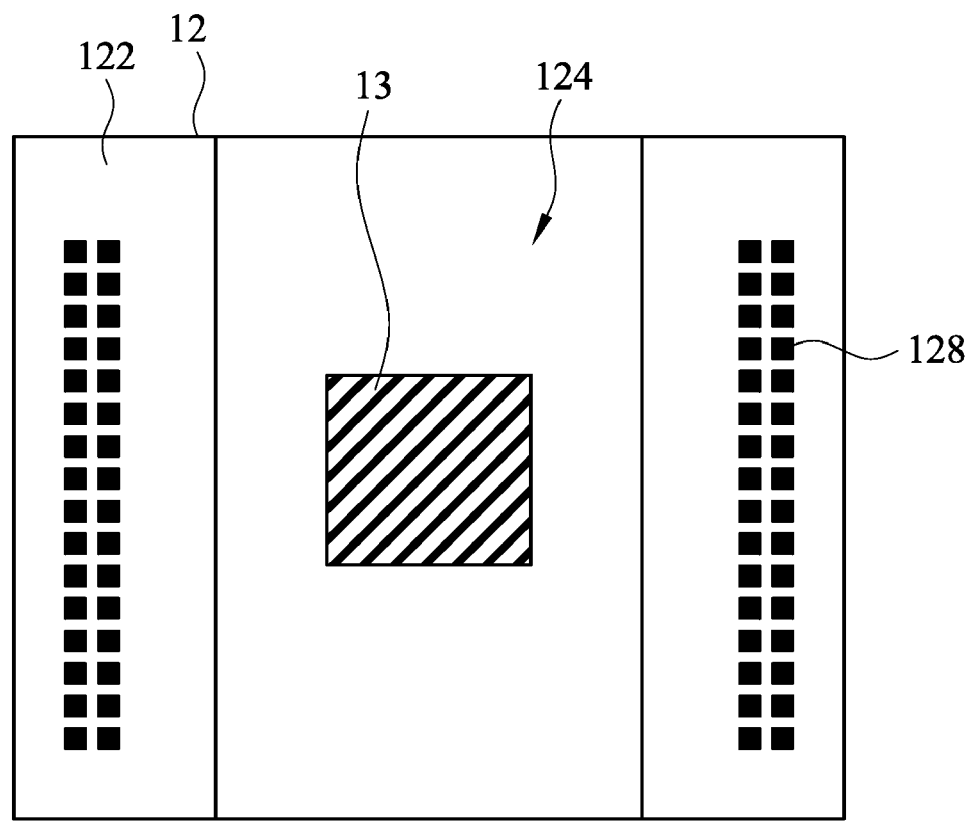
FIG. 6 shows a third aspect of the chip module according to the present invention.

In order to enhance heat dissipation of the module circuit board 12, referring to FIG. 4, the recess 124 is centrally formed in the module circuit board 12 such that the module circuit board 12 has a ring-shaped structure. Alternatively, as shown in FIG. 5, the recess 124 extends through a lateral edge of the module circuit board 12 such that the module circuit board 12 has a U-shaped structure. Further alternatively and preferably, as shown in FIG. 6, the recess 124 extends through two opposite lateral edges of the module circuit board 12, thus providing the module circuit board 12 with a double I-shaped structure.

The preset element 13 can be a processor element, a memory element, an input/output element, a wireless device element, a power management element, a power source element, a sensor element, a heat dissipation element, a display element, a connecting and wiring element, or a combination thereof. Thus, the corresponding chip module 11 can have the function of processing, memorizing, input/output, wireless transmitting, power managing, power source providing, sensing, heat dissipating, displaying, connecting and wiring, or a combination thereof.

Figure 7A:
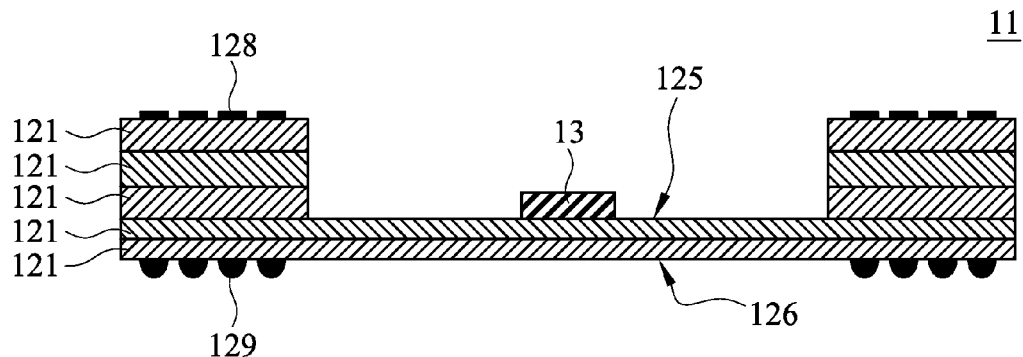
FIG. 7A is a sectional view of another aspect of the chip module according to the present invention.
Figure 7B:
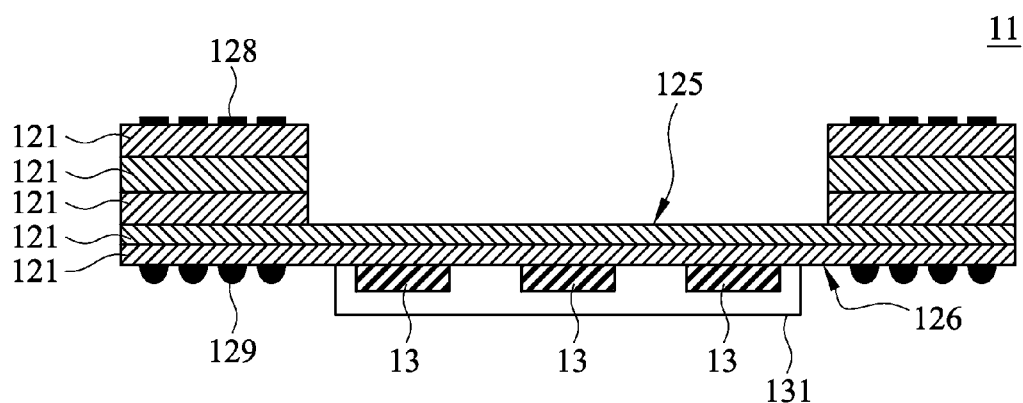
FIG. 7B is a sectional view of yet another aspect of the chip module according to the present invention.
Figure 7C:
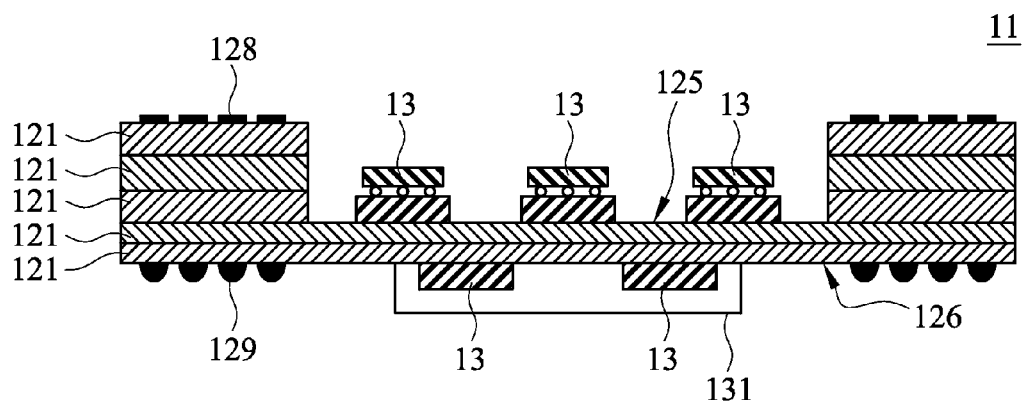
FIG. 7C is a sectional view of still another aspect of the chip module according to the present invention.

Furthermore, the at least one preset element 13 can be a single die, a plurality of dies, or a non-die element. When bare dies are used, as shown in FIG. 7B, the dies are encapsulated by an encapsulation 131 and thus prevented from being affected by moisture or damaged by external force. On the other hand, as shown in FIG. 7C, non-die elements can be package-on-package (PoP) stacked elements made by a stacked package technique. Besides, the at least one preset element 13 can also be at least one chip or a plurality of chips that are already packaged, as shown in FIG. 7A.

Referring to FIG. 3A and FIG. 4, the preset element 13 is electrically connected to the first connecting interface 127 by flip-chip, wire bonding, or like techniques so as to form electrical connection with the circuit layers 121 in the module circuit board 12. Moreover, the at least one preset element 13 can be electrically connected to the first connecting interface 127 in the first region 125, as shown in FIG. 7A; or to the first connecting interface 127 in the second region 126, as shown in FIG. 7B; or to the first connecting interfaces 127 in the first and second regions 125 and 126, respectively, as shown in FIG. 7C.

Referring to FIG. 2A, the vertical SoC module 10 illustrated therein is formed by vertically stacking chip modules 11 composed of module circuit boards 12 having the ring-shaped structure. In this case, the recesses 124 allow the preset elements 13 and the chip modules 11 as a whole to have a large area of contact with the outside, such that heat generated by the preset elements 13 is dissipated effectively. On the other hand, when the module circuit boards 12 have the U-shaped structure, as shown in FIG. 2B, the recesses 124 allow the preset elements 13 to make contact directly with the outside, so that heat dissipation is carried out more effectively. However, when the module circuit boards 12 have the double I-shaped structure, as shown in FIG. 2C, the recesses 124 of the module circuit boards 12 function as heat dissipation paths that enable air circulation and therefore more effective heat dissipation.

Module circuit boards 12 of the foresaid three different structures have their own pros and cons. A module circuit board 12 having the ring-shaped structure is sturdy in structure but poor at heat dissipation. A module circuit board 12 having the double I-shaped structure provides better heat dissipation but is weaker in structure. Therefore, system designers should decide the structure of the module circuit boards 12 according to the use and specifications of the system-on-chip to be made.

Referring back to FIG. 1, each of the connector modules 20a, 20b includes a connecting circuit board 21, and each connecting circuit board 21 is composed of at least two circuit layers 211. For example, each connecting circuit board 21 can be a multilayer printed circuit board or a multilayer ceramic circuit board. Additionally, fourth connecting interfaces 212 are provided on the outer surface (or more specifically, on an upper surface and a lower surface) of each connecting circuit board 21.

Figure 8A:
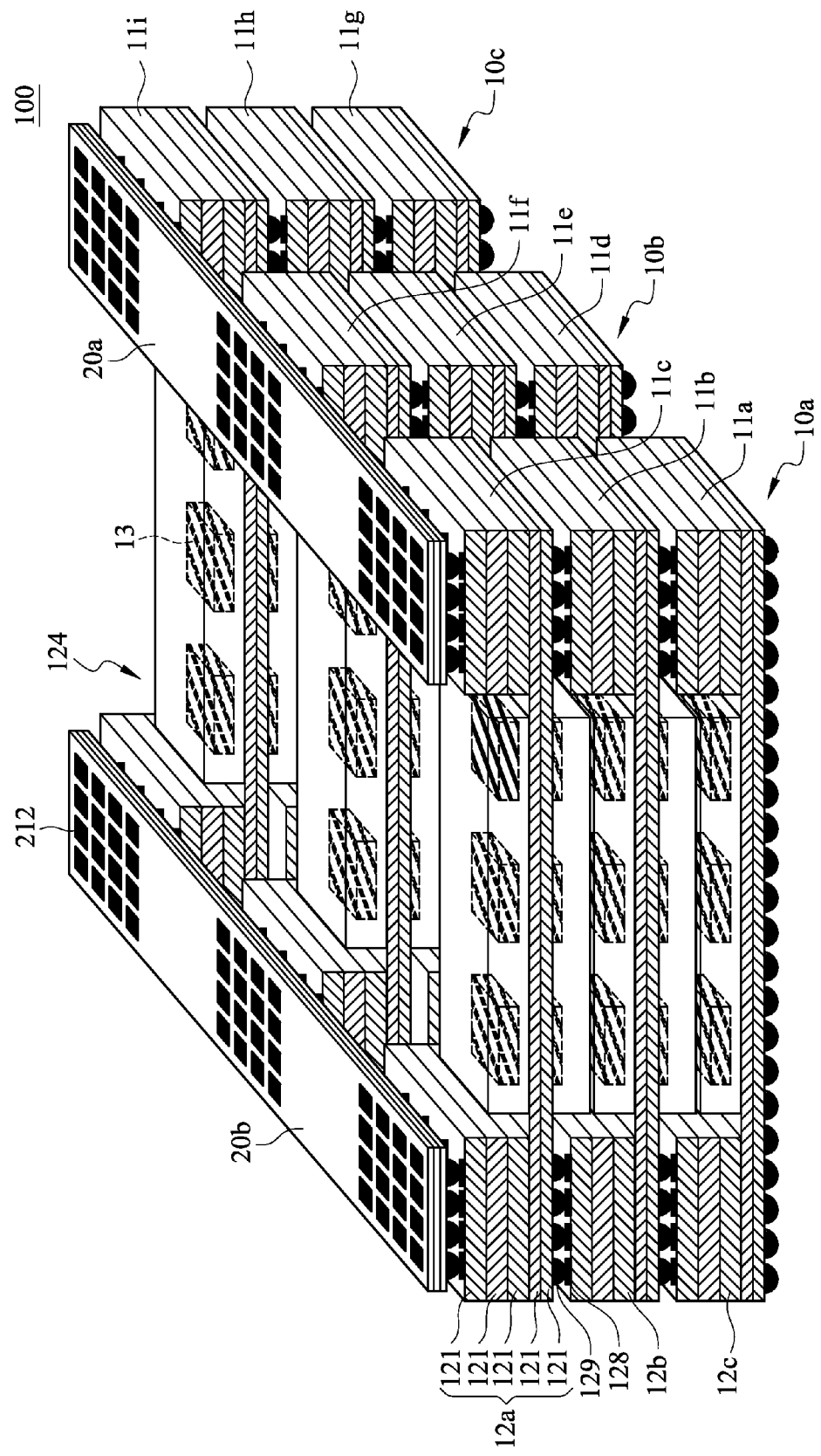
FIG. 8A is a perspective view of a practical embodiment of the three-dimensional SoC structure formed by stacking multiple chip modules according to the present invention.

As shown in FIG. 1, the fourth connecting interfaces 212 electrically connect with the second connecting interfaces 128 of the vertical SoC modules 10a, 10b, or in an embodiment not shown, with the third connecting interfaces 129 of the vertical SoC modules 10a, 10b, such that the connector modules 20a, 20b are electrically connected to the vertical SoC modules 10a, 10b. Moreover, each connecting circuit board 21 may be provided with a plurality of fourth connecting interfaces 212, thus allowing the connector modules 20a, 20b to electrically connect and enable signal exchange between not only two vertical SoC modules 10a, 10b, but also a plurality of vertical SoC modules 10a, 10b, 10c, as shown in FIG. 8A.

Referring to FIG. 2A to FIG. 2C, the vertical SoC module 10 is formed by stacking at least two chip modules 11 vertically. When the chip modules 11 are vertically stacked, the second connecting interface 128 of one module circuit board 12 is in contact and in electrical connection with the third connecting interface 129 of another module circuit board 12. Furthermore, as shown in FIG. 1, a system designer can use the connector modules 20a, 20b to electrically connect any two vertical SoC modules 10a, 10b so as to construct a system-on-chip with multiple functions.

Take for example the embedded system that is frequently used in electronic products nowadays. An embedded system may include two packaged vertical SoC modules 10, wherein one packaged vertical SoC module 10 includes a single die element (e.g., a processor) or a plurality of die elements (e.g., several processors and other dies, such as memories), and the other packaged vertical SoC module 10 has an input/output interface or a hardware design for performing specific functions (e.g., a memory, a wireless device, and a digital signal processor). These two vertical SoC modules 10 can be electrically connected to each other at any time by the connector modules 20a, 20b to form an embedded three-dimensional SoC module with multiple functions.

As each vertical SoC module 10 can be fabricated and verified in advance, the verification process of the system-on-chip is substantially shortened, and the time and costs of development are reduced. Further, since each vertical SoC module 10 has a different function, the functions of a system-on-chip can be easily extended by using the connector modules 20a, 20b to connect additional vertical SoC modules 10 that have the desired functions.

For instance, FIG. 8A shows a three-dimensional SoC structure 100 composed of three vertical SoC modules (namely, a first vertical SoC module 10a, a second vertical SoC module 10b, and a third vertical SoC module 10c) and two connector modules (namely, a first connector module 20a and a second connector module 20b).

Therein, the first vertical SoC module 10a includes a chip module 11a whose preset element 13 is a processor element, a chip module 11b whose preset element 13 is a dynamic random access memory (DRAM) element, and a chip module 11c whose preset element 13 is a north bridge chip element. Meanwhile, the second vertical SoC module 10b includes chip modules 11d, 11e, 11f whose preset elements 13 are a south bridge chip element, a micro hard disc element, and a flash memory element, respectively. Besides, the preset elements 13 in the chip modules 11g, 11h, 11i of the third vertical SoC module 10c are a display chip element, a network device element, and an input/output element, respectively.

The preset elements 13 in each of the vertical SoC modules 10a, 10b, 10c are electrically connected to one another and can exchange signals with one another via the circuit layers 121 of the module circuit boards 12a, 12b, 12c; the third connecting interfaces 129 of the module circuit boards 12a, 12b; and the second connecting interfaces 128 of the module circuit boards 12b, 12c.

Figure 8B:
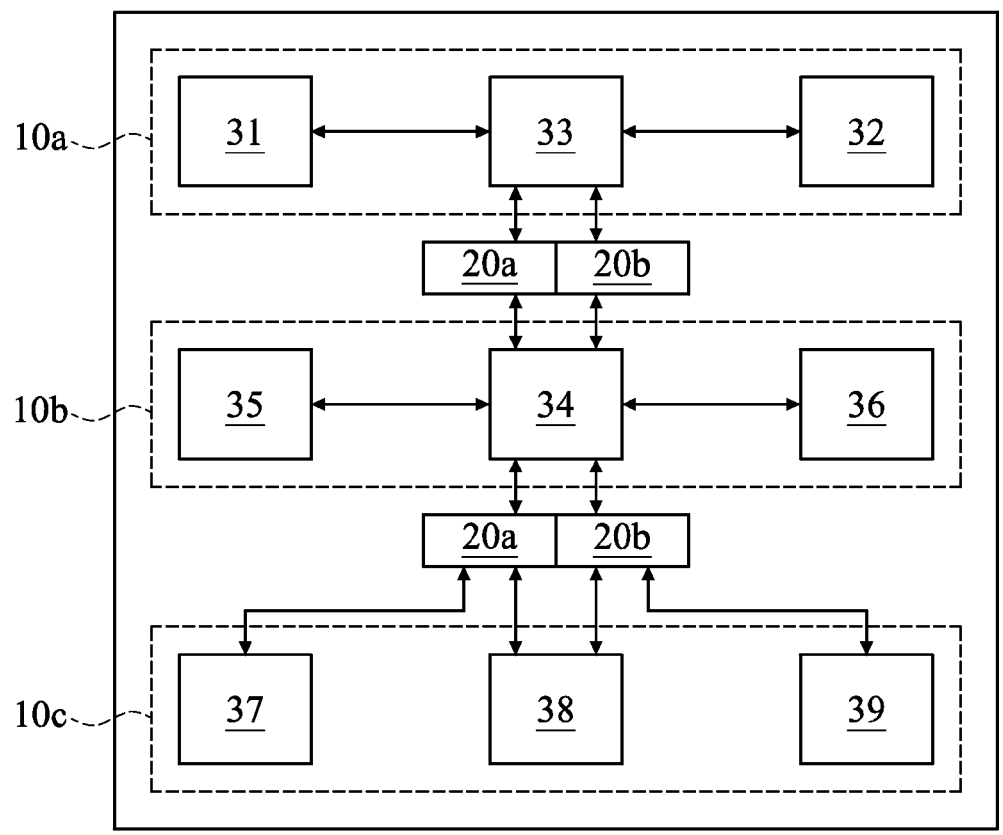
FIG. 8B is a circuit block diagram of the practical embodiment shown in FIG. 8A.

FIG. 8B is a circuit block diagram of the aforesaid vertical SoC modules 10a, 10b, 10c and connector modules 20a, 20b. As shown in FIG. 8A and FIG. 8B, the processor element 31, the DRAM element 32, and the north bridge chip element 33 are electrically connected to one another and can exchange signals with one another via the circuit layers 121 of the module circuit boards 12a, 12b, 12c; the third connecting interfaces 129 of the module circuit boards 12a, 12b; and the second connecting interfaces 128 of the module circuit boards 12b, 12c. Furthermore, the north bridge chip element 33 can exchange signals with the south bridge chip element 34 in the second vertical SoC module 10b via the connector modules 20a, 20b, thus allowing the processor element 31 and the DRAM element 32 to exchange signals with the south bridge chip element 34 via the north bridge chip element 33.

In the second vertical SoC module 10b, the south bridge chip element 34 is electrically connected to the micro hard disc element 35 and the flash memory element 36 via electrical connection between the circuit layers of the three module circuit boards, the third connecting interfaces of the upper two module circuit boards, and the second connecting interfaces of the lower two module circuit boards.

Likewise, the display chip element 37, the network device element 38, and the input/output element 39 in the third vertical SoC module 10c are electrically connected to the south bridge chip element 34 in the second vertical SoC module 10b via the connector modules 20a, 20b. Thus, a system-on-chip fully provided with the functions of a personal computer is formed.

By designing, fabricating, and verifying vertical SoC modules 10 of different functions in advance, the verification process of a system-on-chip can be abbreviated. System designers can complete the fabrication of a system-on-chip simply by connecting the vertical SoC modules 10 of different functions with the connector modules 20a, 20b. Consequently, the time required for developing and testing the system-on-chip is significantly shortened, design errors minimized, and the development costs reduced.

Moreover, the structural design of the vertical SoC modules 10 increases the number of preset elements 13 in a unit area and effectively downsizes the resultant system-on-chip, so that the system-on-chip is applicable to various electronic products.

The foregoing embodiments are illustrative of the characteristics of the present invention so as to enable a person skilled in the art to understand the contents disclosed herein and implement the present invention accordingly. The embodiments, however, are not intended to restrict the scope of the present invention, which is defined only by the appended claims. Hence, all equivalent modifications and changes which do no depart from the spirit of the present invention should be encompassed by the claims.

What is claimed is:

1. A three-dimensional system-on-chip (SoC) structure formed by stacking multiple chip modules, the three-dimensional SoC structure comprising:
at least two vertical SoC modules, each said vertical SoC module formed by stacking at least two said chip modules vertically, wherein each said chip module comprises:
a module circuit board having a first surface and a second surface, the first surface sunken to form a recess having a first region, the second surface having a second region opposite the first region, wherein each of the first region and the second region is provided with a first connecting interface, the first surface is provided with a second connecting interface, and the second surface is provided with a third connecting interface; and
at least one preset element electrically connected to a said first connecting interface; and
at least one connector module comprising a connecting circuit board having an outer surface provided with a fourth connecting interface, each said connector module electrically connecting two said vertical SoC modules;
wherein each said vertical SoC module is constructed in such a way that the second connecting interface of a said chip module contacts with and is therefore electrically connected to the third connecting interface of another said chip module.

2. The three-dimensional SoC structure of claim 1, wherein any said module circuit board, as well as any said connecting circuit board, is a multilayer printed circuit board or a multilayer ceramic circuit board.

3. The three-dimensional SoC structure of claim 1, wherein a said recess is centrally formed in a corresponding said module circuit board such that the corresponding said module circuit board has a ring-shaped structure.

4. The three-dimensional SoC structure of claim 1, wherein a said recess extends through a lateral edge of a corresponding said module circuit board such that the corresponding said module circuit board has a U-shaped structure.

5. The three-dimensional SoC structure of claim 1, wherein a said recess extends through two opposite lateral edges of a corresponding said module circuit board such that the corresponding said module circuit board has a double I-shaped structure.

6. The three-dimensional SoC structure of claim 1, wherein the at least one preset element of each said chip module is a processor element, a memory element, an input/output element, a wireless device element, a power management element, a power source element, a sensor element, a heat dissipation element, a display element, a connecting and wiring element, or a combination thereof.

7. The three-dimensional SoC structure of claim 1, wherein a said preset element is encapsulated by an encapsulation.

8. The three-dimensional SoC structure of claim 1, wherein the at least one preset element of each said chip module is electrically connected to the first connecting interface in a corresponding said first region or the first connecting interface in a corresponding said second region.

9. The three-dimensional SoC structure of claim 1, wherein at least two said preset elements of a said chip module are electrically connected to the first connecting interface in a corresponding said first region and the first connecting interface in a corresponding said second region, respectively.

10. The three-dimensional SoC structure of claim 1, wherein the at least one preset element of each said chip module is a single die, a plurality of dies, a non-die element, a packaged chip, or a package-on-package (PoP) stacked element.

11. The three-dimensional SoC structure of claim 1, wherein each said first connecting interface, as well as each said second connecting interface and each said third connecting interface, is a solder ball array, a land grid array, or a pin grid array.

* * * * *